(12) United States Patent
Uchida

(10) Patent No.: US 10,653,019 B2
(45) Date of Patent: May 12, 2020

(54) SUBSTRATE UNIT

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

(72) Inventor: Koki Uchida, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

( * ) Notice: Subject to any disclaimer, the term of this patent is extended or adjusted under 35 U.S.C. 154(b) by 0 days.

(21) Appl. No.: 16/306,940

(22) PCT Filed: Jun. 6, 2017

(86) PCT No.: PCT/JP2017/021002
§ 371 (c)(1),
(2) Date: Dec. 4, 2018

(87) PCT Pub. No.: WO2017/213144
PCT Pub. Date: Dec. 14, 2017

(65) Prior Publication Data
US 2019/0150303 A1    May 16, 2019

(30) Foreign Application Priority Data

Jun. 8, 2016 (JP) .................................. 2016-114857

(51) Int. Cl.
*H05K 5/00* (2006.01)
*H05K 5/02* (2006.01)

(52) U.S. Cl.
CPC ............. *H05K 5/0056* (2013.01); *H05K 5/00* (2013.01); *H05K 5/0069* (2013.01); *H05K 5/02* (2013.01); *H05K 5/006* (2013.01)

(58) Field of Classification Search
CPC ...... H05K 5/0056; H05K 5/00; H05K 5/0069; H05K 5/02; H05K 5/006
See application file for complete search history.

(56) References Cited

FOREIGN PATENT DOCUMENTS

| JP | 2001-118628 A | 4/2001 |
|---|---|---|
| JP | 2002-335090 A | 11/2002 |

(Continued)

OTHER PUBLICATIONS

International Search Report, Application No. PCT/JP2017/021002, dated Aug. 29, 2017.

*Primary Examiner* — Hoa C Nguyen
*Assistant Examiner* — Keith DePew
(74) *Attorney, Agent, or Firm* — Honigman LLP

(57) ABSTRACT

A substrate unit includes a circuit board; a connector portion mounted on the circuit board; and a case that contains the circuit board. The case includes a lower case having an accommodation section opened upward and accommodating the circuit board. An upper cover covers the accommodation section of the lower case. An aperture is opened in a side wall of the case, allowing the connector portion to be fitted to a counterpart connector portion. The upper cover includes a ceiling portion having a board opposing region that opposes the circuit board accommodated in the accommodation section and an outer region is located outside of the board opposing region without opposing the circuit board; and guide grooves inclined from the board opposing region to the outer region. The guide grooves discharging the water droplets away from the circuit board.

6 Claims, 6 Drawing Sheets

(56) References Cited

FOREIGN PATENT DOCUMENTS

| | | | | |
|---|---|---|---|---|
| JP | 2003-229678 | A | | 8/2003 |
| JP | 2004-096968 | A | | 3/2004 |
| JP | 2006-050814 | A | | 2/2006 |
| JP | 2006-344687 | A | | 12/2006 |
| JP | 2006344687 | A | * | 12/2006 |
| JP | 2011-229253 | A | | 11/2011 |
| JP | 2011229253 | A | * | 11/2011 |
| WO | 2016-158445 | A1 | | 10/2016 |
| WO | WO-2016158453 | A1 | * | 10/2016 ............... G06F 1/16 |

* cited by examiner

453 : 453s, 453x, 453c, 453i, 453o
454 : 454s, 454x, 454c

453: 453s, 453x, 453c, 453i, 453o
454: 454s, 454x, 454c

SUBSTRATE UNIT

CROSS-REFERENCE TO RELATED APPLICATIONS

This application is the U.S. national stage of PCT/JP2017/021002 filed Jun. 6, 2017, which claims priority of Japanese Patent Application No. JP 2016-114857 filed Jun. 8, 2016.

TECHNICAL FIELD

The present disclosure relates to a substrate unit.

BACKGROUND

As described in JP 2014-175365A, a waterproof construction is implemented with a vehicle-mounted case or the like that contains electric equipment to prevent a breakdown of the electric equipment, which is contained in the vehicle-mounted case, due to water infiltration. As in JP 2014-175365A, measures to seal the inside of a case with a sealing member result in an increased cost of manufacturing.

Accordingly, one of the objects is to provide a substrate unit that can reduce the adherence of water droplets to an internal circuit board with a simple construction.

SUMMARY

A substrate unit of this disclosure includes a circuit board; a connector portion mounted on the circuit board; and a case that contains the circuit board. The case includes a lower case having an accommodation section opened upward and accommodating the circuit board and an upper cover that covers the accommodation section of the lower case. An aperture is opened in a side wall of the case, allowing the connector portion to be fitted to a counterpart connector portion. The upper cover includes a ceiling portion having a board opposing region that opposes the circuit board accommodated in the accommodation section and an outer region that is located outside of the board opposing region without opposing the circuit board. A guide grooves inclined from the board opposing region to the outer region guides water droplets present on the board opposing region to the outer region to discharge the water droplets away from the circuit board.

DETAILED DESCRIPTION OF PREFERRED EMBODIMENTS

Advantageous Effects of Disclosure

Figure 1:
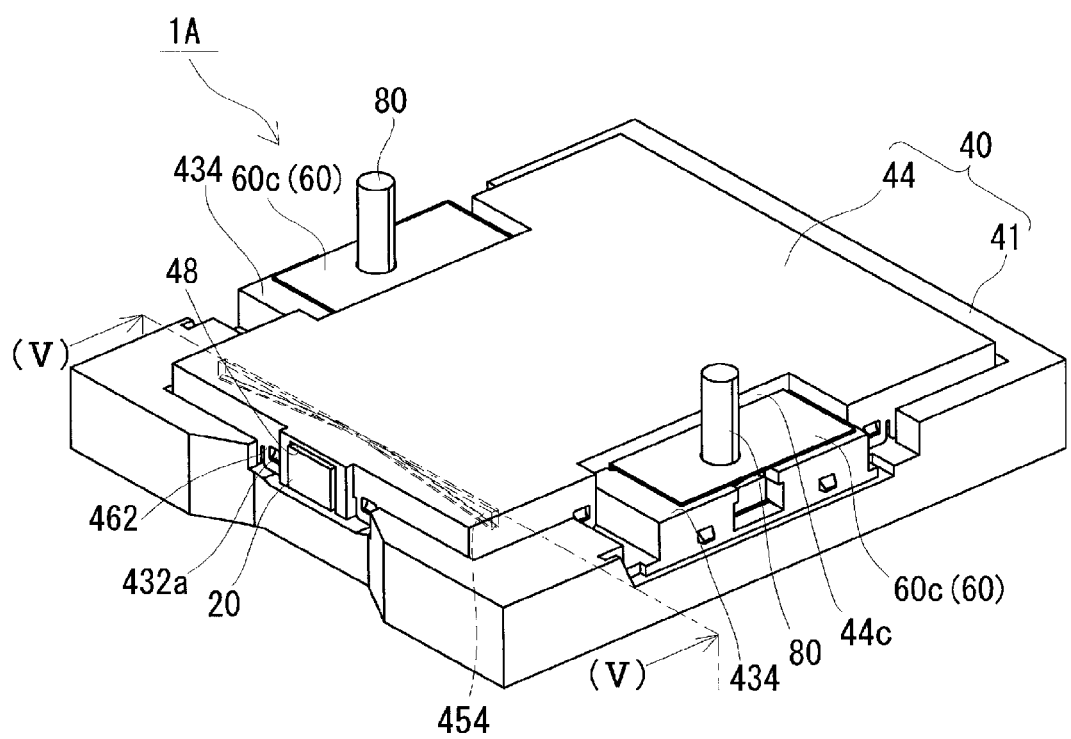
FIG. 1 is a perspective view that shows an overview of a substrate unit according to an Embodiment 1.

The substrate unit of this disclosure can reduce the adherence of water droplets to an internal circuit board with a simple construction.

Description of Embodiments

First, embodiments of the present disclosures will be listed and described.

A substrate unit according to an embodiment of the disclosure includes a circuit board; a connector portion mounted on the circuit board; and a case that contains the circuit board. The case includes a lower case having an accommodation section opened upward and accommodating the circuit board and an upper cover that covers the accommodation section of the lower case. An aperture is opened in a side wall of the case, allowing the connector portion to be fitted to a counterpart connector portion. The upper cover includes a ceiling portion having a board opposing region that opposes the circuit board accommodated in the accommodation section and an outer region that is located outside of the board opposing region without opposing the circuit board. A guide grooves inclined from the board opposing region to the outer region guides water droplets present on the board opposing region to the outer region to discharge the water droplets away from the circuit board.

With foregoing configuration, it is possible to reduce the adherence of water droplets to the circuit board in the case using a simplified structure in which the upper cover includes the guide grooves. This is because the guide grooves can guide the water droplets present on the back surface (undersurface) of the upper cover to the outer region and discharge them to the outside of the circuit board, preventing the water droplets from falling onto the circuit board. Therefore, there is no need to separately provide a waterproofing member, such as a waterproof ring. This results in a reduced number of parts to improve the efficiency of assembly.

The water droplets that are present on the board opposing region are thought to be (1) the water droplets that have infiltrated into the case from the outside (infiltration water) and (2) the water droplets that have condensed from the vapor within the case (condensation water). Infiltration water or condensation water travels along the underside of the upper cover and is guided to the outer region and discharged from the outside of the circuit board.

In an embodiment of the foregoing substrate unit, the board opposing region includes a connector opposing region that opposes the connector portion, wherein the guide grooves are formed from the connector opposing region to the outer region.

With this configuration, it is possible to more effectively reduce the adherence of water droplets to the circuit board. Conventionally, water droplets present on a board opposing region are likely to be those that have infiltrated inside from an opening formed in a side wall of the case, rather than condensed droplets. Accordingly, as the guide grooves are formed in the connector opposing region, which is close to the aperture (an entry point of the water droplets), water droplets that has infiltrated can be guided near the entrance to the outer region, thus facilitating the prevention of the water droplets from infiltrating further into the back of the case (the board opposing region).

In one embodiment of the foregoing substrate unit, in which the board opposing region comprises the connector opposing region, the following can be contemplated.

The ceiling portion may includes inclined ribs that are formed from the connector opposing region to the outer region and that have a height increasing from the connector opposing region toward the outer region, and the guide grooves may be formed in end faces of the ribs.

With the foregoing configuration, it is possible to reduce the adherence of water droplets to the circuit board while increasing the strength of the upper cover.

In one embodiment of the foregoing substrate unit, the following can be contemplated:

The lower case may include a waterproofing wall formed on a circumference of the accommodation section of the lower case to prevent infiltration of water into the accommodation section from outside of the case and an inner wall formed between the waterproofing wall and the accommodation section. The inner wall is spaced apart from the waterproofing walls; wherein outlets of the water droplets in the guide grooves may be disposed between the waterproofing wall and the inner wall; and wherein the waterproofing wall may include a drain that discharges the water droplets discharged between the waterproofing wall and the inner wall out of the waterproofing walls.

With this configuration, not only can the waterproofing walls prevent infiltration of water droplets into the case from the outside, but the inner walls inside of the waterproofing walls can reduce the flow of the water droplets discharged between the waterproofing walls and the inner walls and adherence of the droplets to the circuit board. Moreover, by providing the drains, the water droplets discharged between the waterproofing walls and the inner walls can be discharged to the outside of the waterproofing walls without trapping the droplets.

Detailed Description of Embodiments

Embodiments of the present disclosure will be described in detail hereinafter with reference to the drawings. In the drawings, like reference numerals designate like elements.

Embodiment 1

Substrate Unit

A substrate unit 1A according to an Embodiment 1 will be described hereinafter with reference to FIGS. 1-6. The substrate unit 1A includes a circuit board 10, a connector portion 20 mounted on the circuit board 10, and a case 40 that contains the circuit board 10 and the connector portion 20. The case 40 includes a lower case 41, an upper cover 44, and an aperture 48 opened in a side wall of the case 40. The aperture 48 is opened so that the connector portion 20 can be fitted to a counterpart connector portion (not shown). One characteristic of this substrate unit 1A is that the upper cover 44 is provided with guide grooves 453 that discharge the water droplets present on its back surface (underside) away from the circuit board 10 without letting the water droplets fall onto the circuit board 10. The following describes each of the structures in detail. In the description that follows, in the substrate unit 1A, the lower case 41 side of the case 40 is referred to as the lower side, the upper cover 44 side is referred to as the upper side, the side that is orthogonal to the upper and lower directions of the case 40 and on which the connector portion 20 is disposed is referred to as the front side, and the side opposite thereto is referred to as the rear side. The directions orthogonal to both the upper and lower directions and the front and rear directions are referred to as the right and left directions.

Circuit Board

Figure 2:
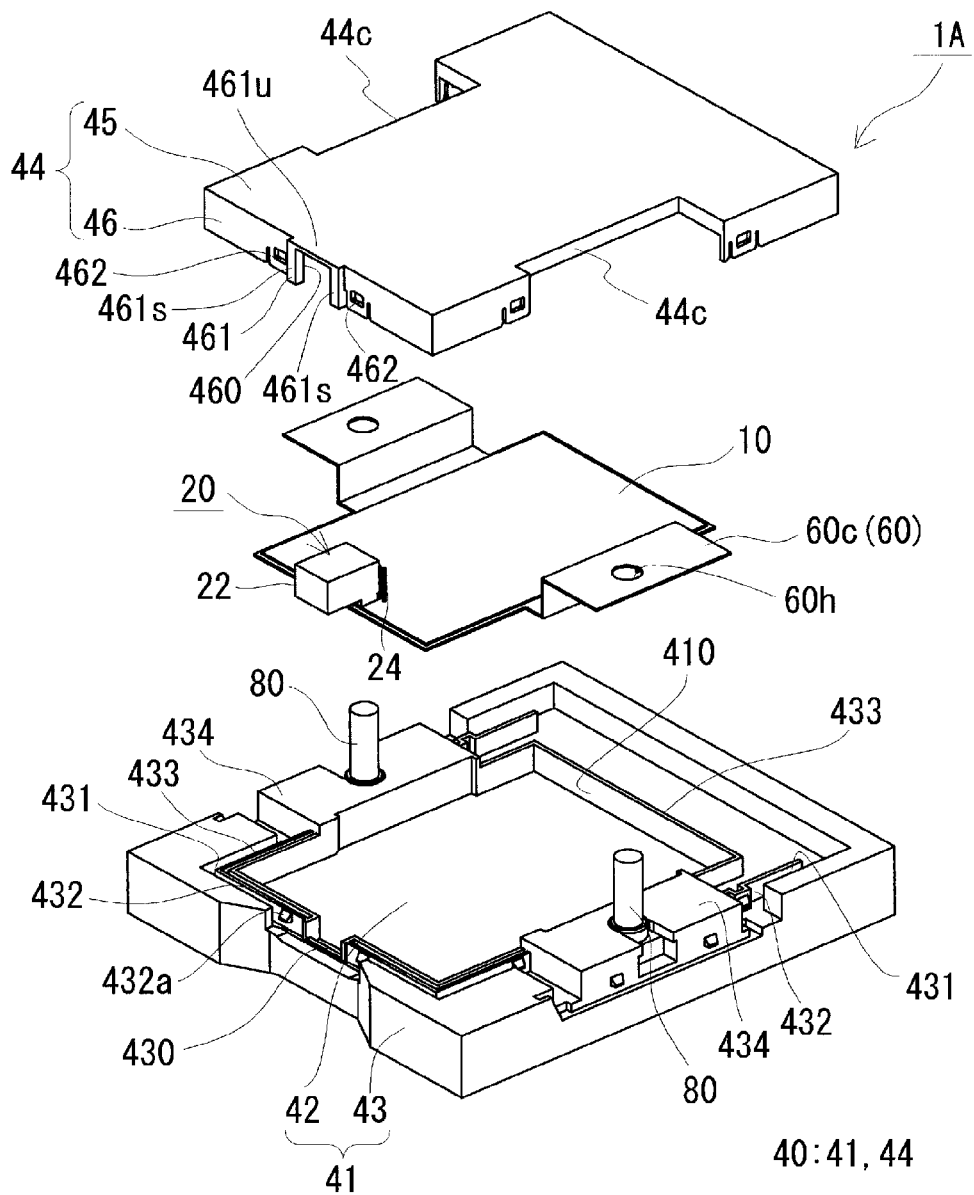
FIG. 2 is an exploded perspective view that shows an overview of the substrate unit according to Embodiment 1.

Semiconductor relays and other electronic components (not shown) as well as the connector portion 20 are mounted on the circuit board 10 (FIG. 2). The circuit board 10 has an insulating substrate and a circuit (conductive) pattern (not shown) formed on one side thereof to electrically connect the electronic components. A printed board may be used as the circuit board 10.

Connector Portion

The connector portion 20 connects the counterpart connector portion (not shown) to the substrate unit 1A. The connector portion 20 includes a hood-shaped connector housing 22 that is open outward to allow the connector housing to be fitted to the counterpart connector portion, and a connector terminal 24 that extends from the inside of the connector housing 22 toward the circuit board 10 (FIG. 2). In FIG. 1 and FIG. 2, for convenience of description, the connector housing 22 is shown to have a columnar shape. The connector terminal 24 penetrates the rear wall of the connector housing 22 opposite to the opening with one end thereof disposed within the connector housing 22 and the other end thereof electrically connected to the conductive pattern formed on the circuit board 10 (FIG. 2). This electrical connection may be made by a known technique, such as soldering. The counterpart connector portion is connected to vehicle-mounted electric equipment or the like, via a wire harness.

Case

The case 40 contains the circuit board 10 (FIG. 2) and the connector portion 20. As shown in FIG. 1, the case 40 is constructed by combining the lower case 41 and the upper cover 44. The aperture 48 (FIG. 1) is formed in a side wall of the case 40, which is formed by combining the lower case 41 and the upper cover 44, to form an opening between the lower case 41 and the upper cover 44 that allows the connector portion 20 to be fitted to the counterpart connector portion. The connector portion 20 is positioned with respect to the case 40 by being sandwiched between the lower case 41 and the upper cover 44.

Upper Cover

The upper cover 44 covers (FIG. 1) an accommodation section 410 (FIG. 2) of the lower case 41. As shown in FIG. 2, the upper cover 44 is a monolithic article that comprises a ceiling portion 45 forming the top surface of the case 40 and shallow side walls 46 erected on the circumference of the ceiling portion 45. The upper cover 44 is formed in a shape that covers the top of the lower case 41 while exposing base portions 434 of the lower case 41 and has cutouts 44c in portions of its outer walls. The cutouts 44c ensure gaps to pass extended portions 60c of busbars 60 (described below) even with the upper cover 44 secured to the lower case 41. These gaps allow the extended portions 60c of the busbars 60 to be mounted on the top surfaces of the base portions 434.

Ceiling Portion

Figure 4:
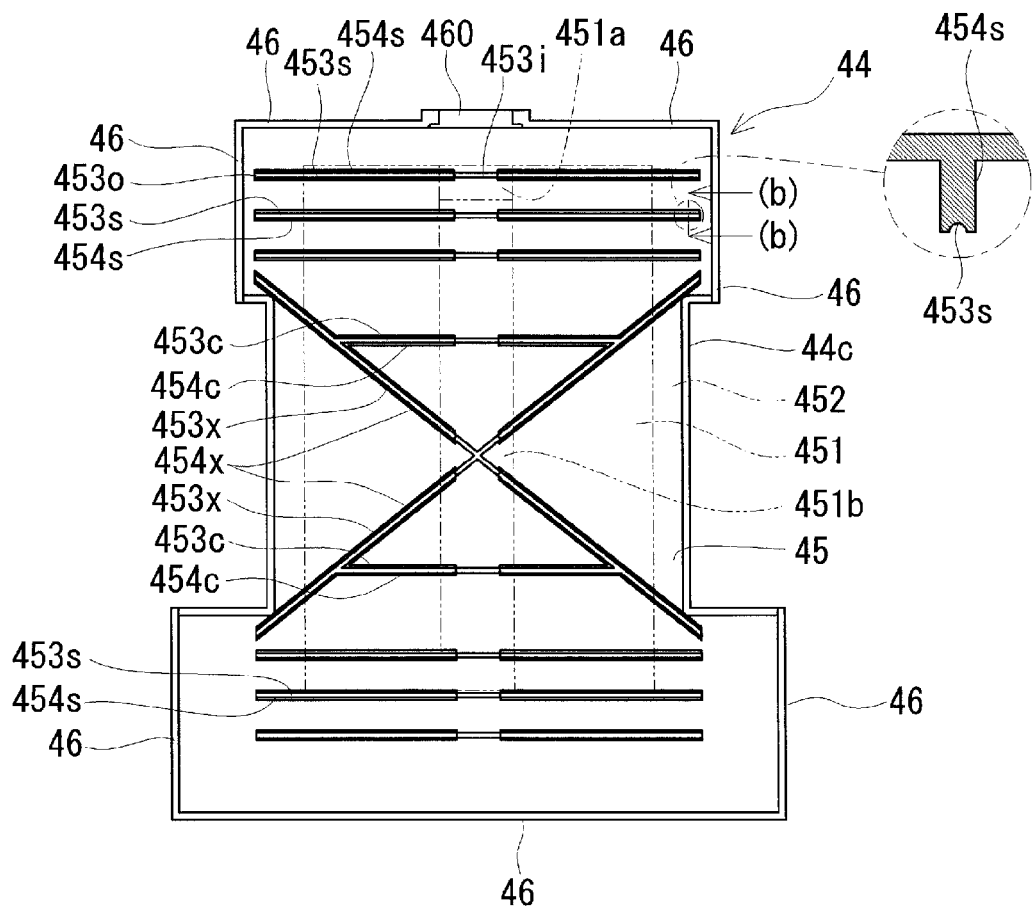
FIG. 4 is a bottom view that shows an overview of the underside of the upper cover provided in the substrate unit according to Embodiment 1.

As shown in FIG. 4, the ceiling portion 45 includes a board opposing region 451 (see the circumference of the chain double-dashed lines) that opposes the circuit board 10, which is accommodated in the accommodation section 410, and outer region 452 that are located outside of the board opposing region 451 without opposing the circuit board 10. Here, the ceiling portion 45 has an approximately rectangular planar shape, and the underside of the ceiling portion 45 has a flat shape. The underside of the ceiling portion 45 may have inclined surfaces that are downwardly inclined from its lateral center toward its right and left sides (a triangular roof shape). The board opposing region 451 has the same rectangular shape as the circuit board 10. The outer region 452 form an approximately rectangular frame that surrounds the board opposing region 451. The board opposing region 451 includes a connector opposing region 451*a* that opposes the connector portion 20 and an extended region 451*b* that extends from the connector opposing region 451*a* along the axial direction of the connector portion 20.

Figure 3:
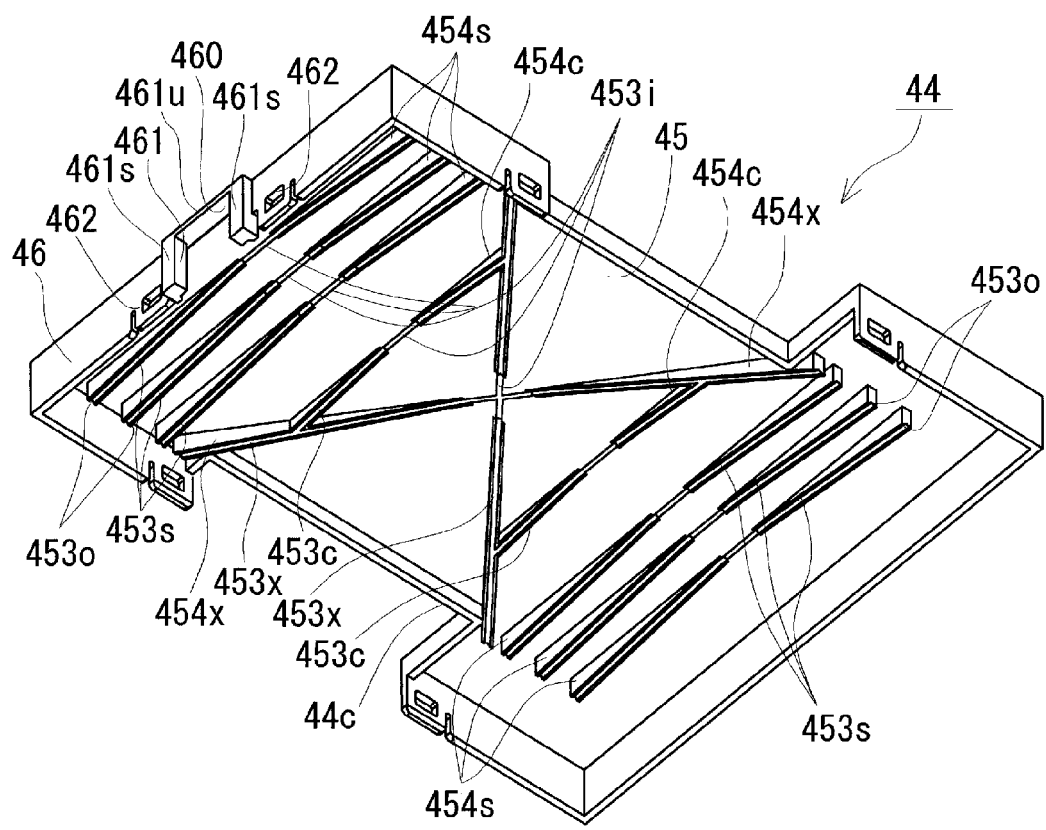
FIG. 3 is a perspective view that shows an overview of the underside of the upper cover provided in the substrate unit according to Embodiment 1.

Formed in the underside of the ceiling portion 45 are the guide grooves 453 that prevent the water droplets present on the underside from falling onto the circuit board 10 (FIG. 3 and FIG. 4). Here, ribs 454 are formed on the underside of the ceiling portion 45, and the guide grooves 453 are continuously formed along the underside of the ceiling portion 45 and the end faces of the ribs 454.

Guide Grooves

The guide grooves 453 guide the water droplets present on the board opposing region 451 towards the outer region 452 and discharge them to the outside of the circuit board 10. This can keep the water droplets present on the board opposing region 451 from falling onto and adhering to the circuit board 10. The water droplets that are present within the board opposing region 451 may be (1) water droplets that have infiltrated into the case 40 from the outside (infiltration water) or (2) water droplets that have condensed from the vapor within the case 40 (condensation water).

(1) Infiltration Water

Water droplets on the case 40 may flow along the surface of the case toward the aperture 48 formed in the sidewall and infiltrate into the case 40 between the aperture 48 and the connector portion 20.

(2) Condensation Water

If a large amount of water vapor is in the case 40, for example, if the case 40 has a large volume, condensation water droplets may adhere to the underside of the upper cover 44 if the case 40 is cooled by the outside air.

Infiltration water or condensation water travels along the underside of the upper cover 44 and enters the guide grooves 453. The water droplets in the guide grooves 453 are guided from the board opposing region 451 to the outer region 452 and discharged away from the circuit board 10.

The guide grooves 453 are inclined from the board opposing region 451 to the outer region 452. An example of being inclined is to have an increasingly shallower depth from the board opposing region 451 to the outer region 452. Another is, as in this example, a case where the guide grooves 453 themselves are inclined relative to the horizontal direction due to the inclined ribs 454, which will be described below, while the depth from the board opposing region 451 to the outer region 452 is uniform.

The number of the guide grooves 453 may be one or more. In any case, preferably, one guide groove 453 is provided at least in the vicinity of the aperture 48, for example, from the connector opposing region 451*a* of the board opposing region 451 to the outer region 452 on the right and left. In this way, the water droplets that have infiltrated into the case 40 can be easily prevented from falling onto the circuit board 10. This is because the proximity of the guide groove 453 to the aperture 48, which is the entry point of the water droplets into the case 40, allows infiltrating water droplets to be guided near the entrance to the outer region 452, thus facilitating prevention of the water droplets from infiltrating further to the rear of the case 40. The longitudinal direction of the guide grooves 453 formed from the connector opposing region 451*a* to the outer region 452 on the right and left is preferably the right and left direction. In this way, the distance of the guide grooves 453 to the outer region 452 can easily be shortened while forming the guide grooves 453 linearly so as to facilitate the discharge of water droplets away from the circuit board 10 without causing the water droplets to fall to the circuit board 10.

If the number of guide grooves 453 is two or more, the guide grooves 453 are preferably formed from the extended region 451*b* to the outer region 452 on the right and left in addition to being formed from the connector opposing region 451*a* to the outer region 452 on the right and left. In this way, the water droplets from vapor condensation in the case 40 can be easily prevented from falling onto the circuit board 10. The longitudinal directions of the guide grooves 453 formed from the extended region 451*b* to the outer region 452 on the right and left may be selected as required. For example, the guide grooves 453 may be formed in the right and left directions like those formed from the connector opposing region 451*a* to the outer region 452, or they may be formed obliquely so as to intersect the right and left directions and the front and rear directions. It is preferable to distribute the guide grooves 453 evenly over the underside of the ceiling portion 45 to easily prevent condensed water droplets from falling onto the circuit board 10 wherever the water droplets are present on the underside of the ceiling portion 45.

Here, three lateral guide grooves 453*s* arranged in the front and rear in parallel rows (six in total), central oblique guide grooves 453*x* in a cross shape, and two connecting guide grooves 453*c* arranged in front and rear positions opposite to each other across the intersection of the oblique guide grooves 453*x* are formed on the underside of the ceiling portion 45.

The frontmost lateral guide groove 453*s* of the three lateral guide grooves 453*s* extends along the right and left directions and is formed from the lateral center of the connector opposing region 451*a* to the right and left outer region 452. The remaining five lateral guide grooves 453 are formed from the lateral center of the extended region 451*b* to the outer region 452 on the right and left.

The oblique guide grooves 453*x* intersect both the right and left directions and the front and rear directions and are formed approximately from the center of the extended region 451*b* to the outer region 452 on the right and left. The oblique guide grooves 453*x* are in communication with each other at the center.

The two connecting guide grooves 453*c* are oriented along the right and left directions and are formed from the extended region 451*b* to the two oblique guide grooves 453*x*. The two connecting guide grooves 453*c* are in communication with the two oblique guide grooves 453*x*.

Each guide groove 453 is provided with a water droplet inlet 453*i* located in the connector opposing region 451*a* or the extended region 451*b*, respectively. Each inlet 453*i* is located in the center area or the intersection of the guide groove 453. The opening end of the water droplet inlet 453*i* of each guide groove 453 is flush with the underside of the ceiling portion 45. This makes it easy for water droplets to flow into the guide grooves. The water droplet outlet 453*o* of each guide groove 453 is disposed between a waterproofing wall 432 and an inner wall 433, which will be described below, of the lower case 41 (see enlarged view of FIG. 5). Therefore, the water droplets flowing through the guide grooves 453 fall between the waterproofing walls 432 and the inner walls 433 and are discharged.

The cross-sectional shape of the guide grooves 453 may be selected as required. Here, the cross section of the guide grooves 453 has a semicircular shape (see enlarged cross section taken along line (b)-(b) of FIG. 4). The guide grooves 453 preferably have a width that affords capillarity. Due to the capillarity with the guide grooves 453 serving as capillary vessels, the water droplets present on the board opposing region 451 can be easily guided to the outer region 452 along the guide grooves 453. The smaller the width of the guide grooves 453 is, the more capillarity is provided. It is preferred, however, that the width of the guide grooves 453 is not too narrow. In this way, the passage of water droplets through the guide grooves 453 is less likely to be impeded. The depth of the guide grooves 453 may be selected as required according to the locations where they are formed. If the guide grooves 453 are formed in the end faces of the ribs 454 as in this example, the guide grooves 453 may have a uniform depth along the longitudinal direction.

Ribs

The ribs 454 reinforce the ceiling portion 45. In this case, the ribs 454 are used to form a portion of the guide grooves 453. The more ribs 454 there are, the stronger the ceiling portion 45 becomes.

Considering that the guide grooves 453 are formed where the ribs 454 are formed, the ribs 454 may be provided from the board opposing region 451 to the outer region 452. This is because this allows the guide grooves 453 to be formed from the board opposing region 451 to the outer region 452. More specifically, they may also be provided from the connector opposing region 451a or the extended region 451b of the board opposing region 451 to the outer region 452.

If the ribs 454 are formed in the areas from the connector opposing region 451a to the outer region 452, the guide grooves 453 can be provided from the connector opposing region 451a to the outer region 452. Therefore, the water droplets that have infiltrated into the case 40 can be easily prevented from falling onto the circuit board 10. The longitudinal directions of the ribs 454 formed in the right and left directions from the connector opposing region 451a to the outer region 452 on the right and left are preferably the right and left directions.

If the ribs 454 are formed in the areas from the extended region 451b to the outer region 452, the guide grooves 453 can be provided from the extended region 451b to the outer region 452. Therefore, the water droplets from vapor condensation in the case 40 can be easily prevented from falling onto the circuit board 10. The longitudinal directions of the ribs 454 formed from the extended region 451b to the outer region 452 may be the right and left or oblique directions.

If the number of ribs 454 is two or more, some of the ribs 454 may be connected with each other. In that case, the guide grooves 453 at the end faces of the connected ribs 454 may be in communication with each other.

Here, three pairs of lateral ribs 454s arranged in parallel rows at both the front or rear (six pairs in total), four approximately central, oblique ribs 454x in a cross shape, and two pairs of connecting ribs 454c arranged in front and rear positions opposite to each other across the center and connected to the oblique ribs 454x are formed on the underside of the ceiling portion 45.

The pairs of lateral ribs 454s extend in the right and left directions with the ribs linearly spaced apart from each other. The frontmost pair of the lateral ribs 454s of the three front pairs of lateral ribs 454s extends along the right and left directions from near the right and left ends of the connector opposing region 451a to the outer region 452 on the right and left. The remaining five pairs of lateral ribs 454s are formed from near the right and left ends of the extended region 451b to the outer region 452 on the right and left. A continuous lateral guide groove 453s is formed on the underside of the ceiling portion 45 between each pair of lateral ribs 454s and in the end faces of the pair of lateral ribs 453s.

Two of the four oblique ribs 454x extend along each of the intersecting diagonal directions, with each pair of ribs spaced apart from each other along the same diagonal. The four oblique ribs 454x are formed from near the right and left ends of the extended region 451b to the outer region 452 on the right and left to intersect both the right and left directions and the front and rear directions. A continuous oblique guide groove 454x is formed in the underside of the ceiling portion 45 between two oblique ribs 454x along each diagonal and formed in the end faces of these oblique ribs 454x.

The pairs of connecting ribs 454c extend in the right and left directions with the ribs linearly spaced apart from each other. Each pair of connecting ribs 454c is formed from near the right and left ends of the extended region 451b to the oblique ribs 454x. A continuous connecting guide groove 453c is formed on the underside of the ceiling portion 45 between the connecting ribs 454c of each pair and in the end faces of the pairs of connecting ribs 453c.

The ribs 454 are inclined (triangular) and have a height that increases from the connector opposing region 451a and the extended region 451b toward the outer region 452. One end of each rib 454 (on the side of the water droplet inlet 453i) is formed adjacent to the right or left sides of the connector opposing region 451a or the extended region 451b. In this way, the ribs 454 do not impede inflow of water droplets into the guide grooves 453 but facilitate inflow of water droplets into the guide grooves 453. The other end of each rib 454 (on the side of the outlet 453o) is formed in the outer region 452. This makes it possible to provide, in the outer region 452, the outlet 453o of the guide groove 453 formed in the end face of the rib 454. This facilitates the flow of water droplets to the outer region 452 and prevents water droplets from falling onto the circuit board 10.

Side Walls

Figure 5:
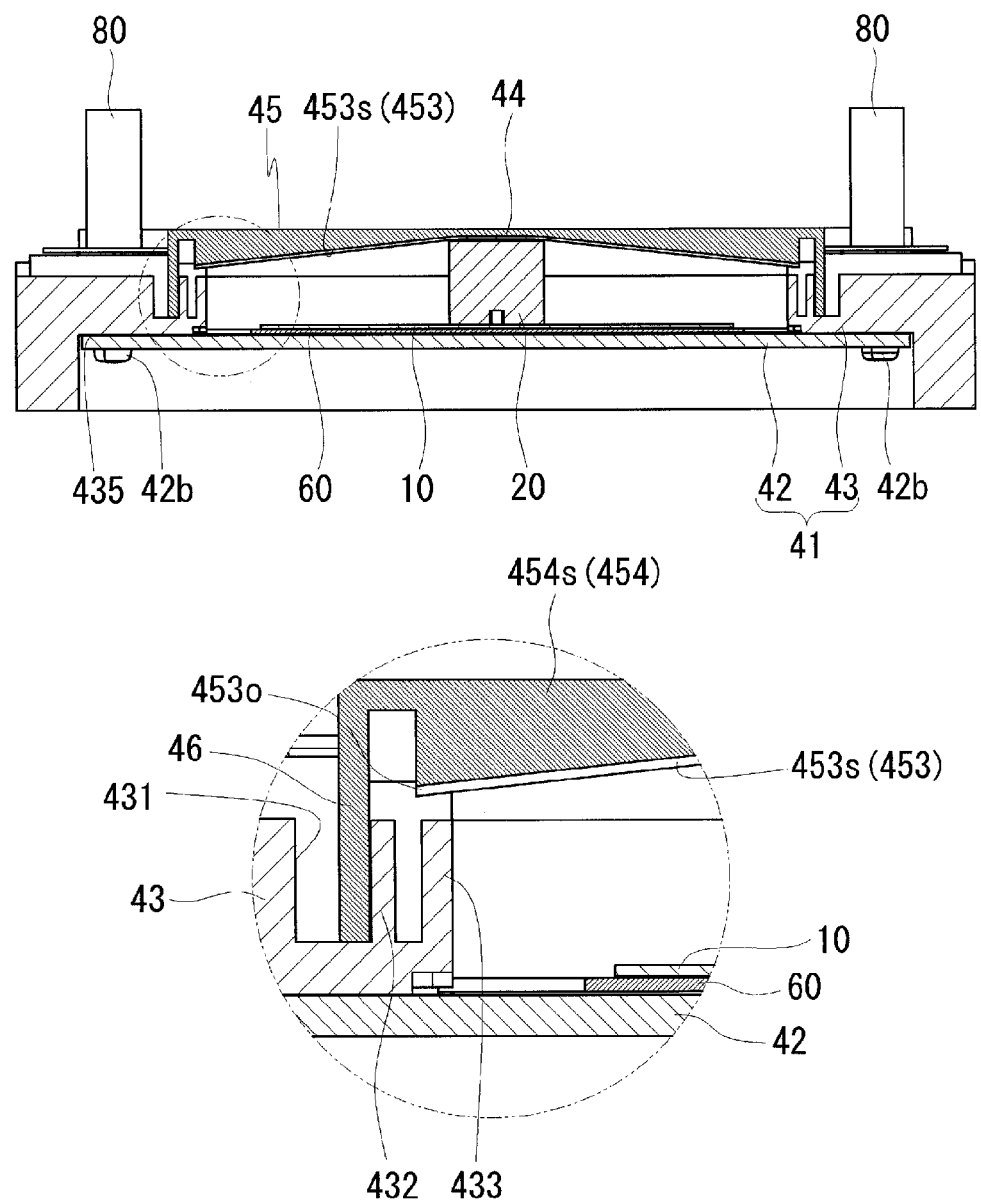
FIG. 5 is a cross sectional view showing the section of the substrate unit taken on line (V)-(V) shown in FIG. 1.
Figure 6:
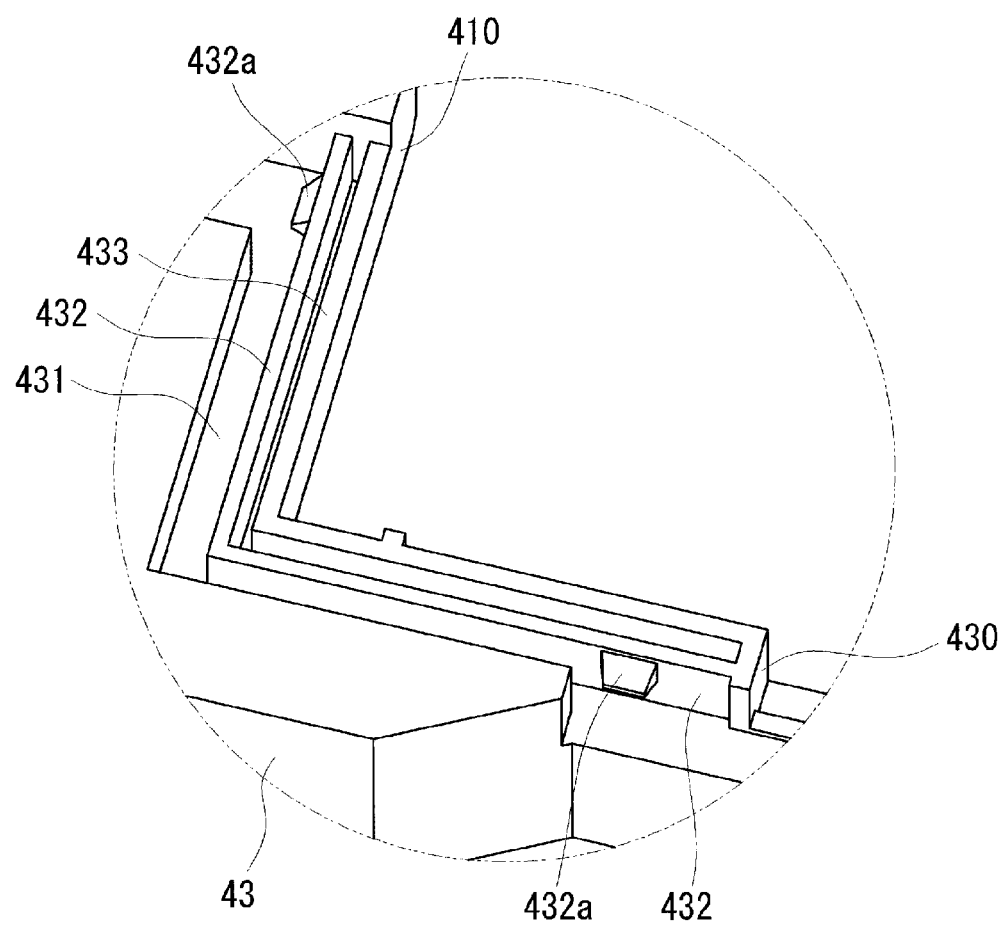
FIG. 6 is a perspective view that shows an overview of the underside of the waterproofing walls and the inner walls of the lower case provided in the substrate unit according to Embodiment 1.

The side walls 46 engage the lower case 41 to integrate the upper cover 44 and the lower case 41. This prevents the infiltration of water into the case 40 from the outside. The side walls 46 are formed around the circumferential edges of the ceiling portion 45 except for the central portions of the right and left sides. That is, the side walls 43 are formed continuously at the front circumferential edge of the ceiling portion 45 and the front circumferential edges on the right and left sides, and continuously at the rear circumferential edge of the ceiling portion 45 and the rear circumferential edges on the right and left sides. The side walls 46 are inserted into the insertion grooves 431 formed in the top surface of the lower case 41 (FIG. 2, FIG. 5, and FIG. 6). The side walls 46 include an upper recess 460, a protrusion 461, and engaging holes 462.

Upper Recess

The upper recess 460 forms the aperture 48, in which the connector portion 20 is disposed, in cooperation with a lower recess 430 of the lower case 41. The upper recess 460 is formed in a location that corresponds to the lower recess 430, that is, in the central portion of the front side wall 46. The upper recess 460 is sized as required so that the connector portion 20 can be disposed in the aperture 48, which is formed in cooperation with the lower recess 430, and so that the upper recess can be positioned with respect to the case 40 of the connector portion 20. The connector portion 20 is disposed in the upper recess 460 so as to expose its top end to the outside.

Protrusion

The protrusion 461 is formed around the upper recess 460, protruding outward to cover the exposed portion of the connector portion 20. As shown in FIG. 2, the protrusion 461 has an inverted U-shaped end face that includes an upper portion 461u and two side portions 461s that surround the upper end and both sides of the connector portion 20. The lower ends of the protrusion 461 (the lower ends of the side portions 461s) are located lower than the lower edge of the aperture 48 (the connector portion 20). The upper portion 461u of the protrusion 461 is formed as a flat surface approximately flush with a surface (the top surface) of the ceiling portion 45.

Engaging Holes

The engaging holes 462 engage engaging protrusions 432a on the lower case 41 (the waterproofing walls 432) when the side walls 46 are inserted into the insertion grooves 431 of the lower case 41. This engagement maintains the insertion of the side walls 46 in the insertion grooves 431, thereby securing the upper cover 44 and the lower case 41 together. The engaging holes 462 are formed in suitable positions on the circumference of the side walls 46, in this case, in the front side wall 46 and the right and left side walls 46.

Synthetic resins, such as polypropylene (PP) resin and polyamide (PA) resin, can be listed as possible materials for the upper cover 44.

Lower Case

The lower case 41 contains the circuit board 10 (FIG. 2), the connector portion 20, and the busbars 60 (to be described below) (FIG. 2). The lower case 41 is comprised of a bottom portion 42 and shallow side walls 43 erected on the bottom portion 42 and has a box shape with an opening at the opposite side to the bottom portion 42 (i.e. at the upper side). Formed in the area surrounded by the bottom portion 42 and the side walls 43 is the accommodation section 410, in which the circuit board 10, the connector portion 20, and the busbars 60 are accommodated. In this example, the bottom portion 42 and the side walls 43 are not formed in one piece but distinct members that are integrated by fixing members, such as screws 42b, (FIG. 5). The bottom portion 42 and the side walls 43 may also be formed in one piece.

Bottom Portion

The circuit board 10 and the busbars 60, which will be described below, are mounted on the bottom portion 42 (FIGS. 2 and 5). The bottom portion 42 has a planar shape larger than the circuit board 10 and the busbars 60. Formed in the bottom portion 42 are insertion holes (not shown) into which the screws 42b, for integration with the side walls 43, are inserted. The bottom portion 42 constitutes a heat sink for radiating the heat of the electronic components mounted on the circuit board 10. For example, an aluminum or other metal plate may be used as the heat sink.

Side Walls

The side walls 43 form, in cooperation with the bottom portion 42, the accommodation section 410 that accommodates the circuit board 10 and the busbars 60 (FIG. 2). The side walls 43 define an approximately rectangular frame body that is formed continuously around the entire circumference of the bottom portion 42 and surrounds the four sides of the circumference of the circuit board 10 including the connector portion 20. The side walls 43 include a lower recess 430 formed at their top surface, the insertion grooves 431, the waterproofing walls 432, the inner walls 433, the base portions 434, and step portions 435 formed on their underside (FIG. 5).

Lower Recess

The lower recess 430 forms, in cooperation with the upper recess 460 of the upper cover 44, the aperture 48 (FIG. 1), in which the connector portion 20 is disposed. The lower recess 430 is formed in the location that corresponds to the upper recess 460, which is the central portion of the front side wall 43. The lower recess 430 is sized as required so that the connector portion 20 can be disposed in the aperture 48, which is formed in cooperation with the upper recess 460, and so that the upper recess can be positioned with respect to the case 40 of the connector portion 20.

Insertion Grooves

The side walls 46 of the upper cover 44 are inserted in the insertion grooves 431 (FIG. 2 and FIG. 6). The locations where the insertion grooves 431 are formed (the shape as seen from the above) may be selected as required according to the locations where the side walls 46 of the upper cover 44 are formed (the shape as seen from the bottom). The insertion grooves 431 are formed around the top surfaces of the side walls 43 except for the central portions of the right and left sides. The insertion grooves 431 are formed in both right and left corners of the front side wall 43 and both right and left corners at the rear. The front insertion grooves 431 have an L-shape in a planar view and the rear insertion grooves 431 have an I-shape in a planar view. The widths and the depths of the insertion grooves 431 can be selected as required according to the thickness of the side walls 46 of the upper cover 44 and the amount of insertion.

Waterproofing walls

The waterproofing walls 432 are formed at the circumference of the accommodation section 410 to prevent the infiltration of water into the accommodation section 410 from the outside of the case 40 (FIG. 2 and FIG. 6). The waterproofing walls 432 form the side faces of the insertion grooves 431, and when the upper cover 44 is inserted into the insertion grooves 431, the waterproofing walls 432 are disposed between the side walls 46 of the upper cover 44 and the accommodation section 410 and come into contact with the inner surfaces of the side walls 46 of the upper cover 44. The waterproofing walls 432 are formed in the locations that correspond to those of the insertion grooves 431, that is, at both right and left corners of the front side wall 43 and at both right and left corners at the rear. The front waterproofing walls 432 have an L-shape in a planar view and the rear waterproofing walls 432 have an I-shape in a planar view. The waterproofing walls 432 include the engaging protrusions 432a and drains (not shown).

The engaging protrusions 432a engage the engaging holes 462 in the side walls 46 of the upper cover 44 when the upper cover is inserted in the insertion grooves 431 (FIG. 2 and FIG. 6). This engagement secures the upper cover 44 and the lower case 41 together. The engaging protrusions 423a are formed in suitable positions on the circumference of the side walls 43 where they correspond to the engaging holes 462, that is, in the front waterproofing wall 432 and the right and left waterproofing walls 432.

The drains discharge the water droplets discharged between the drains and the inner walls 433 to the outside of the waterproofing walls 432.

Inner Walls

The inner walls 433 prevent the water droplets discharged from the guide grooves 453 from moving into the accommodation section 410 (FIG. 2 and FIG. 6).

The inner walls 433 are formed between the waterproofing walls 432 and the accommodation section 410 and are spaced apart from the waterproofing walls 432. The inner walls 433 form the edge of the accommodation section 410. The inner walls 433 are formed in locations that correspond to those of the waterproofing walls 432, that is, at both right and left corners of the front side wall 43 and from the rear right corner to the rear left corners. The front inner walls 433 have an L-shape in a planar view and the rear waterproofing walls 433 have a "[" shape in a planar view.

Base Portions

The base portions 434 include terminal fixing portions where male thread portions 80 are fixed. The base portions 434 are formed on the top surfaces of the center area of the right and left sides. Extended portions 60c of the busbars 60 are mounted on the base portions 434.

Step Portions

The bottom portion 42 is fitted into the step portions 435 (FIG. 5). The step portions 435 are formed on the inner circumferential edges of the underside of the side walls 43. Screw holes (not shown) in which the screws 42b are fixed, which integrate with the side walls 42, are formed in the step portions 435.

As in the case of the upper cover 44, synthetic resins, such as a PP resin and a PA resin, can be listed as possible materials for the lower case 41.

Busbars

The busbars 60 constitute a power circuit. The busbars 60 are connected to a power source or electrical loads. The number of busbars 60 is more than one, and the plurality of busbars 60 are arranged in a predetermined layout. The busbars 60 include a central portion with the extended portions 60c elongated stepwise to the right and left thereof. The front portion of the central portion of the busbars 60 is positioned below the connector portion 20 and interposed between the underside of the circuit board 10 and the top surface of the bottom portion 42. The central portion and the extended portions 60c are formed in one piece. The central portion is formed in a planar shape that is interposed between the underside of the circuit board 10 and the top surface of the bottom portion 42. The extended portions 60c are disposed on the top surfaces of the base portions 434 of the lower case 41. The extended portions 60c are bent stepwise to continuously extend from both sides of the central portion.

The extended portions 60c are portions for electrically connecting external equipment, and connection terminals of unshown electrical wiring (a wire harness) are electrically connected to the extended portions. Terminal insertion holes 60h through which the male thread portions 80 are inserted are formed in the extended portions 60c. The male thread portions 80 fixed in the terminal fixing portions of the lower case 41 are inserted through the terminal insertion holes 60h. A wire harness (not shown) is connected to the male thread portions 80. The busbars 60 and the wire harness are electrically connected via the male thread portions 80. Conductive metals, specifically, copper and copper alloy, etc., can be listed as possible materials for the busbars 60. An adhesive sheet (not shown) interposed between the circuit board 10 and the busbar 60 can be used to secure the circuit board 10 and the busbars 60 together.

Usage

The substrate unit 1A may be preferably used as a substrate unit disposed in a location where waterproofing is not required in an automobile. Additionally, the substrate unit 1A may be used as a high-current control unit, such as a direct voltage converter, an AC-DC converter, and a DC-AC inverter.

Operation and Effect

In the substrate unit 1A of Embodiment 1, to reduce the adherence of water droplets to the circuit board 10 in the case 40, a simplified construction is used, in which the inclined ribs 454 are formed on the underside of the ceiling portion 45 of the upper cover 44 and the guide grooves 453 are formed in their end faces, rather than separately providing a waterproofing member, such as a waterproof ring. This is because, even if water droplets adhere to the underside of the ceiling portion 45 of the upper cover 44 due to the infiltration of water droplets into the case 40 from the outside or the vapor in the case 40 condensing to water droplets, the water droplets can be discharged away from the circuit board 10 through the guide grooves 453 formed in the end faces of the inclined ribs 454, thus preventing the water droplets from falling onto the circuit board 10. Therefore, the substrate unit 1A can ensure drip-proofing without separately providing a water proof member. Accordingly, it can be preferably used to ensure waterproofing against water droplets (drip-proofing). Furthermore, as no waterproofing member needs to be separately provided, the number of parts can be reduced, improving the efficiency of assembly of the substrate unit 1A.

Variation 1

The ribs can be omitted from the substrate unit of Variation 1 so that the guide grooves are directly formed in the underside (back surface) of the ceiling portion rather than in the end faces of the ribs. In that case, it is preferred that the depth of the guide grooves is made increasingly shallower from the board opposing region (the connector opposing region and the extended region) toward the outer region. In this way, the water droplets present on the board opposing region can be guided to the outer region to keep them from falling onto and adhering to the circuit board.

Variation 2

In the substrate unit of Variation 2, the underside of the ceiling portion may have inclined surfaces that are downwardly inclined from its lateral center toward its right and left sides (a triangular roof shape). In that case, the depth of the guide grooves and the height of the ribs may be uniform in their longitudinal directions. In this way, as the underside itself of the ceiling portion is inclined from the board opposing region toward the outer region, the guide grooves can guide the water droplets present on the board opposing region to the outer region.

The present disclosure is not limited by these examples but indicated by the appended claims, and all changes that come within the meaning and range of equivalency of the claims are intended to be encompassed within the scope of the disclosure.

The invention claimed is:

1. A substrate unit, comprising:
a circuit board;
a connector portion mounted on the circuit board; and
a case that contains the circuit board;
wherein the case comprises:
    a lower case having an accommodation section opened upward and accommodating the circuit board;
    an upper cover that covers the accommodation section of the lower case; and
    an aperture opened in a side wall of the case, allowing the connector portion to be seated therein; and
wherein the upper cover comprises:

a ceiling portion including an underside having a board opposing region that opposes the circuit board accommodated in the accommodation section and an outer region bounding a periphery of the board opposing region, the outer region does not oppose the circuit board; and guide grooves inclined from the board opposing region to the outer region, guide grooves having a water inlet that is flush with the underside of the ceiling portion and an end wall opposite the water inlet, the end wall being generally orthogonal to the underside of the ceiling portion so as to form a water droplet outlet, the water droplet outlet disposed on the outer region of the ceiling portion, the guide grooves guiding water droplets present on the board opposing region to the outer region of the ceiling portion to discharge the water droplets away from the circuit board.

2. The substrate unit according to claim 1, wherein the board opposing region includes a connector opposing region that opposes the connector portion, wherein the guide grooves are formed from the connector opposing region to the outer region.

3. The substrate unit according to claim 2, wherein the ceiling portion includes inclined ribs that are formed from the connector opposing region to the outer region and that have a height increasing from the connector opposing region toward the outer region, and wherein the guide grooves are formed in end faces of the ribs.

4. The substrate unit according to claim 3, wherein the lower case comprises:

a waterproofing wall formed on a circumference of the accommodation section of the lower case to prevent infiltration of water into the accommodation section from outside of the case; and an inner wall formed between the waterproofing wall and the accommodation section, the inner wall being spaced apart from the waterproofing walls;

wherein outlets of the water droplets in the guide grooves are disposed between the waterproofing wall and the inner wall; and wherein the waterproofing wall includes a drain that discharges the water droplets discharged between the waterproofing wall and the inner wall out of the waterproofing walls.

5. The substrate unit according to claim 2, wherein the lower case comprises:

a waterproofing wall formed on a circumference of the accommodation section of the lower case to prevent infiltration of water into the accommodation section from outside of the case; and an inner wall formed between the waterproofing wall and the accommodation section, the inner wall being spaced apart from the waterproofing walls;

wherein outlets of the water droplets in the guide grooves are disposed between the waterproofing wall and the inner wall; and wherein the waterproofing wall includes a drain that discharges the water droplets discharged between the waterproofing wall and the inner wall out of the waterproofing walls.

6. The substrate unit according to claim 1, wherein the lower case comprises:

a waterproofing wall formed on a circumference of the accommodation section of the lower case to prevent infiltration of water into the accommodation section from outside of the case; and an inner wall formed between the waterproofing wall and the accommodation section, the inner wall being spaced apart from the waterproofing walls;

wherein outlets of the water droplets in the guide grooves are disposed between the waterproofing wall and the inner wall; and wherein the waterproofing wall includes a drain that discharges the water droplets discharged between the waterproofing wall and the inner wall out of the waterproofing walls.

* * * * *